(12) United States Patent
Lipson et al.

(10) Patent No.: US 11,016,401 B2
(45) Date of Patent: May 25, 2021

(54) SUBSTRATES AND METHODS OF USING THOSE SUBSTRATES

(71) Applicants: ASML HOLDING N.V., Veldhoven (NL); ASML NETHERLANDS B.V., Veldhoven (NL)

(72) Inventors: Matthew Lipson, Stamford, CT (US); Christopher John Mason, Newtown, CT (US); Damoon Sohrabibabaheidary, Norwalk, CT (US); Jimmy Matheus Wilhelmus Van De Winkel, Kessel (NL); Bert Dirk Scholten, Best (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/610,103

(22) PCT Filed: May 1, 2018

(86) PCT No.: PCT/EP2018/061063
§ 371 (c)(1),
(2) Date: Nov. 1, 2019

(87) PCT Pub. No.: WO2018/215172
PCT Pub. Date: Nov. 29, 2018

(65) Prior Publication Data
US 2020/0073262 A1 Mar. 5, 2020

Related U.S. Application Data

(60) Provisional application No. 62/511,247, filed on May 25, 2017.

(51) Int. Cl.
*G03F 7/20* (2006.01)

(52) U.S. Cl.
CPC ........ *G03F 7/70925* (2013.01); *G03F 7/7095* (2013.01)

(58) Field of Classification Search
CPC ............. G03F 7/70925; G03F 7/70341; G03F 7/70908–70958; G03F 7/70858–70891;
(Continued)

(56) References Cited

U.S. PATENT DOCUMENTS 5,969,441 A 10/1999 Loopstra et al.
6,046,792 A 4/2000 Van Der Werf et al.
(Continued)

FOREIGN PATENT DOCUMENTS

| EP | 1586386 | 10/2005 |
|----|---------|---------|
| JP | H053139 | 1/1993 |

(Continued)

OTHER PUBLICATIONS

International Search Report and Written Opinion issued in corresponding PCT Patent Application No. PCT/EP2018/061063, dated Aug. 20, 2018.
(Continued)

*Primary Examiner* — Christina A Riddle
(74) *Attorney, Agent, or Firm* — Pillsbury Winthrop Shaw Pittman LLP (57) ABSTRACT

A method of dislodging contamination from a part of an apparatus used in a patterning process, the method including: providing a cleaning substrate into contact with the part of the apparatus while the part is attached to the apparatus, the cleaning substrate comprising a material configured to chemically react with the contamination; and dislodging contamination on the part of the apparatus by chemical reaction between the material and the contamination.

21 Claims, 6 Drawing Sheets

(58) Field of Classification Search
CPC .... G03F 7/70975; G03F 7/70991; G03F 7/42; B08B 1/001; B08B 7/0028; B08B 7/0035; B08B 7/04; G02B 27/0006; Y10T 29/49764
USPC ....... 355/30, 52–55, 67–77; 134/1, 1.3, 4, 6, 134/9, 15, 21, 32, 44, 56 R, 57 R, 84, 134/113, 201
See application file for complete search history.

(56) References Cited

U.S. PATENT DOCUMENTS

| | | | | |
|---|---|---|---|---|
| 6,392,738 | B1* | 5/2002 | van de Pasch | G03F 7/707 355/30 |
| 2001/0051494 | A1* | 12/2001 | Sventek | B24B 7/241 451/41 |
| 2002/0112300 | A1* | 8/2002 | Muhr-Sweeney | H04N 1/00127 15/104.002 |
| 2003/0011763 | A1 | 1/2003 | Taniguchi et al. | |
| 2005/0274898 | A1* | 12/2005 | Watanabe | G03F 7/70916 250/372 |
| 2008/0257383 | A1* | 10/2008 | Levinson | H01L 21/02057 134/6 |
| 2010/0039628 | A1* | 2/2010 | Shiraishi | G03F 7/70925 355/30 |
| 2010/0103392 | A1* | 4/2010 | Matsui | G03F 7/70341 355/30 |
| 2012/0167924 | A1* | 7/2012 | Chen | B24B 53/017 134/33 |
| 2013/0077065 | A1 | 3/2013 | Lafarre et al. | |
| 2014/0174468 | A1* | 6/2014 | Park | B08B 7/0035 134/6 |

FOREIGN PATENT DOCUMENTS

| | | |
|---|---|---|
| JP | 2000228439 | 8/2000 |
| JP | 2009016838 | 1/2009 |
| JP | 2010103363 | 5/2010 |
| WO | 2004050266 | 3/2006 |

OTHER PUBLICATIONS

Japanese Office Action issued in corresponding Japanese Patent Application No. 2019-558715, dated Oct. 6, 2020.

* cited by examiner

大专栏  SUBSTRATES AND METHODS OF USING THOSE SUBSTRATES

SUBSTRATES AND METHODS OF USING THOSE SUBSTRATES

CROSS-REFERENCE TO RELATED APPLICATIONS

This application is the U.S. national phase entry of PCT/EP2018/061063, filed May 1, 2018, which claims the benefit of priority of U.S. Provisional Patent Application No. 62/511,247, which was filed on May 25, 2017, and which is incorporated herein in its entirety by reference.

FIELD

The description herein relates to a substrate and a method of using such a substrate.

BACKGROUND

A lithographic apparatus can be used, for example, in the manufacture of devices such as integrated circuits (ICs). In such a case, a patterning device (e.g., a mask) may contain or provide a pattern corresponding to an individual layer of the device ("design layout"), and this pattern can be transferred onto a target portion (e.g. comprising one or more dies) on a substrate (e.g., silicon wafer) that has been coated with a layer of material to receive the pattern ("resist"), by methods such as irradiating the target portion with radiation patterned, according the pattern, from the patterning device. In general, a single substrate contains a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general in this case, the lithographic apparatus will have a magnification factor M (generally <1), the speed F at which the substrate is moved will be a factor M times that at which the projection beam scans the patterning device. More information with regard to lithographic apparatuses as described herein can be gleaned, for example, from U.S. Pat. No. 6,046,792, incorporated herein by reference in its entirety.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, metrology (e.g., SEM), etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

So, manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are typically involved in the patterning process.

SUMMARY

A significant issue encountered in a patterning process is contamination. For example, contamination of a substrate support surface of a substrate holder may increase the number of defects in a pattern or a plurality of patterns on the substrate. A further example of where contamination may be a problem is in immersion lithography. In immersion lithography, an immersion fluid is used to increase the numerical aperture of a projection system used in the lithographic apparatus. An immersion fluid may therefore be used between the final element of a projection system and the substrate itself. The immersion fluid may become contaminated by particles or flakes of resist or other materials which become separated from the substrate or from layers deposited on the substrate. That immersion fluid can come into various parts including support surfaces of substrates. So, the contamination can make it difficult or impossible to accurately project a (patterned) radiation beam onto the substrate via the immersion fluid.

It is desirable to provide, for example, one or more substrates and one or more methods of using the one or more substrates which obviate or mitigate one or more of the problems of the prior art, whether identified herein or elsewhere.

In an embodiment, there is provided a method of dislodging contamination from a part of an apparatus used in a patterning process, the method comprising: providing a cleaning substrate into contact with the part of the apparatus while the part is attached to the apparatus, the cleaning substrate comprising a material configured to chemically react with the contamination; and dislodging contamination on the part of the apparatus by chemical reaction between the material and the contamination.

In an embodiment, there is provided a cleaning substrate for dislodging contamination from a part of an apparatus used in a patterning process, the cleaning substrate having a size and shape essentially corresponding to a substrate for device manufacturing in the patterning process and the cleaning substrate comprising a material configured to chemically react with the contamination. In an embodiment, the contamination comprises silica and the chemical reaction is between the material and silica.

In an embodiment, there is provided a combination comprising: a cleaning substrate comprising a material configured to chemically react with contamination; and a non-transitory computer program product comprising machine-readable instructions configured to cause a computer to cause providing of the cleaning substrate into contact with a part of an apparatus used in a patterning process while the part is attached to the apparatus, where upon the material chemically reacts with the contamination to dislodge the contamination on the part of the apparatus.

In an embodiment, there is provided a non-transitory computer program product comprising machine-readable instructions for causing a processor to cause performance of a method as described herein.

In an embodiment, there is provided an apparatus used in a process to apply patterns to a substrate, the apparatus comprising a control system configured to cause performance of a method as described herein or to use a cleaning substrate as described herein to clean at least part of the apparatus.

In an embodiment, there is provided a system comprising: a lithographic apparatus comprising a pattern transfer system arranged to transfer a pattern onto a resist-coated substrate; and a non-transitory computer program product as described herein. In an embodiment, the lithographic apparatus further comprises a support structure configured to hold a patterning device to modulate a radiation beam for projection by the pattern transfer system to the substrate.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

Features and advantages of embodiment will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

Figure 1:
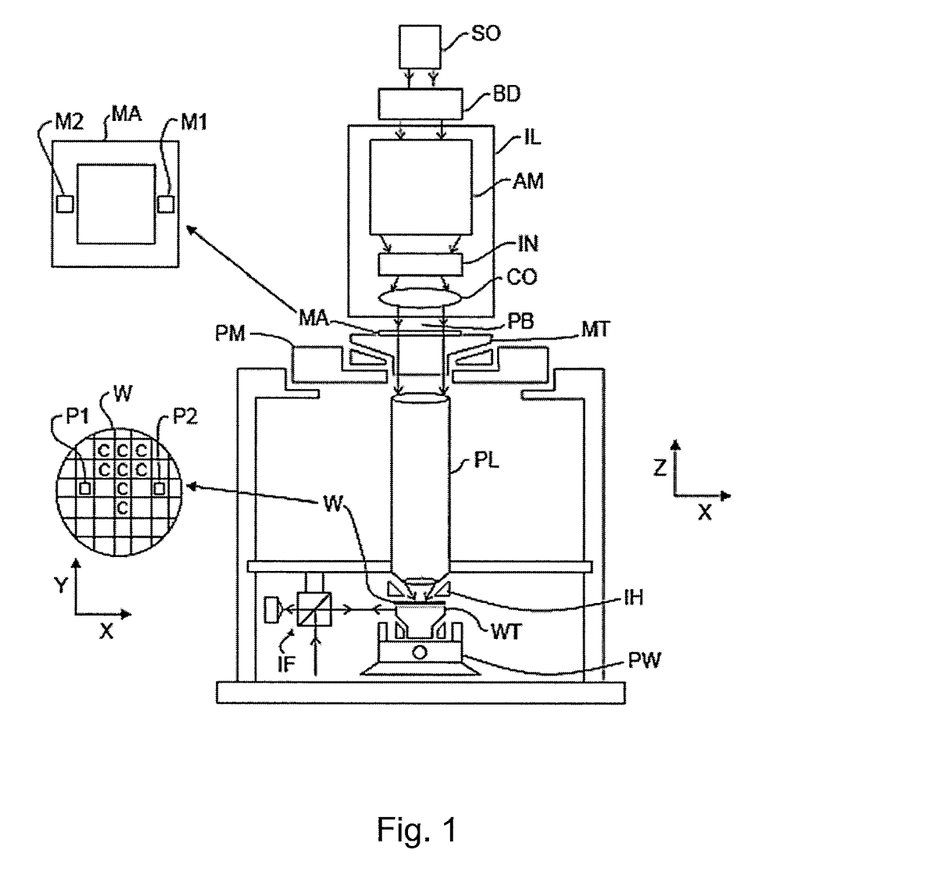
FIG. 1 is a schematic diagram of a lithographic projection apparatus.

FIG. 1 schematically depicts an exemplary lithographic projection apparatus for use with embodiments described herein. The apparatus comprises:

- an illumination system (illuminator) IL to condition a beam B of radiation (e.g. UV radiation). In this particular case, the illumination system also comprises a radiation source SO;
- a first structure (e.g., patterning device table) MT provided with a patterning device holder to hold a patterning device MA (e.g., a reticle), and connected to a first positioner PM to accurately position the patterning device with respect to item PL;
- a second structure (e.g., substrate table) WT provided with a substrate holder to hold a substrate W (e.g., a resist-coated silicon wafer), and connected to a second positioner PW to accurately position the substrate with respect to item PL;
- a projection system ("lens") PL (e.g., a refractive, catoptric or catadioptric optical system) configured to image an irradiated portion of the patterning device MA onto a target portion C (e.g., comprising one or more dies) of the substrate W; and
- an immersion fluid confinement structure IH (sometimes referred to as an immersion hood) configured to at least partly retain an immersion fluid (e.g., liquid) between the projection system PL and a part of the substrate W. The immersion fluid confinement structure IH is optional (although desirable to make small structures).

As depicted here, the apparatus is of a transmissive type (i.e., employing a transmissive mask). However, in general, it may also be of a reflective type, for example (with a reflective mask).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and/or a programmable LCD array.

The structure MT holds the patterning device in a way depending on the orientation of the patterning device, the design of the lithographic apparatus, and other conditions, such as whether or not the patterning device is held in a vacuum environment. The structure MT can use mechanical clamping, vacuum, or other clamping techniques, for example electrostatic clamping under vacuum conditions. The structure MT may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The source SO (e.g., a mercury lamp or excimer laser) produces a beam of radiation. The source and the lithographic apparatus may be separate entities, for example when the source is an excimer laser. It should be noted with regard to FIG. 1 that the source SO may be within the housing of the lithographic projection apparatus (as is often the case when the source SO is a mercury lamp, for example). The source SO may also be remote from the lithographic projection apparatus, the radiation beam that it produces being passed into the apparatus (e.g., with the aid of a beam delivery system BD comprising for example suitable directing mirrors and/or a beam expander); this latter scenario is often the case when the source SO is an excimer laser (e.g., based on KrF, ArF or $F_2$ lasing). In such cases, the source is not considered to form part of the lithographic apparatus. The source SO and the illuminator IL, together with the beam delivery system BD if required, may be referred to as a radiation system.

The illuminator IL receives a beam of radiation from a radiation source SO, either directly or after having traversed one or more conditioning devices, such as a beam expander, for example. The illuminator IL may comprise adjuster AM configured to adjust the spatial and/or angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section, to impinge on the patterning device MA.

The illumination system may also encompass various types of optical components, including refractive, reflective, and catadioptric optical components for directing, shaping, or controlling the beam of radiation, and such components may also be referred to below, collectively or singularly, as a "lens".

The beam PB subsequently intercepts the patterning device MA, which is held on a structure MT. Having traversed the patterning device MA, the beam PB passes through the projection system PL, which focuses the beam PB onto a target portion C of the substrate W via, e.g., an immersion fluid retained by the optional immersion fluid confinement structure IH. With the aid of the second positioning device PW (and positioning measurement device (e.g. an interferometric device) IF), the structure WT can be moved accurately, e.g. so as to position different target portions C in the path of the beam PB. Similarly, the positioning device PM and another position sensor (which is not explicitly depicted in FIG. 1) can be used to accurately position the patterning device MA with respect to the path of the beam PB, e.g., after mechanical retrieval of the patterning device MA from a patterning device library, or during a scan. In general, movement of the object structures MT, WT will be realized with the aid of a long-stroke module (coarse positioning) and a short-stroke module (fine positioning), which form part of the positioning device PM and PW and are not explicitly depicted in FIG. 1. However, in the case of a stepper (as opposed to a scanner tool) the structure MT may just be connected to a short stroke actuator, or may be fixed. Patterning device MA and substrate W may be aligned using patterning device alignment marks M1, M2 and substrate alignment marks P1, P2.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more movable structures (e.g., tables) below the projection system (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are known in the art for increasing the numerical aperture of projection systems.

The depicted apparatus can be used in one or more of the following modes:

1. In step mode, the structure MT and the structure WT are kept essentially stationary, while an entire pattern imparted to the beam PB is projected onto a target portion C in one go (i.e. a single static exposure). The structure WT is then shifted in the X and/or Y direction so that a different target portion C can be exposed. In step mode, the maximum size of the exposure field limits the size of the target portion C imaged in a single static exposure.

2. In scan mode, the structure MT and the structure WT are scanned synchronously while a pattern imparted to the beam PB is projected onto a target portion C (i.e. a single dynamic exposure). The velocity and direction of the structure WT relative to the support structure MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion. Thus, in an embodiment, the structure MT is movable in a given direction (the so-called "scan direction", e.g., the y direction) with a speed v, so that the projection beam PB is caused to scan over a patterning device image; concurrently, the structure WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

3. In another mode, the structure MT is kept essentially stationary holding a programmable patterning device, and the structure WT is moved or scanned while a pattern imparted to the beam PB is projected onto a target portion C. In this mode, generally a pulsed radiation source is employed and the programmable patterning device is updated as required after each movement of the structure WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
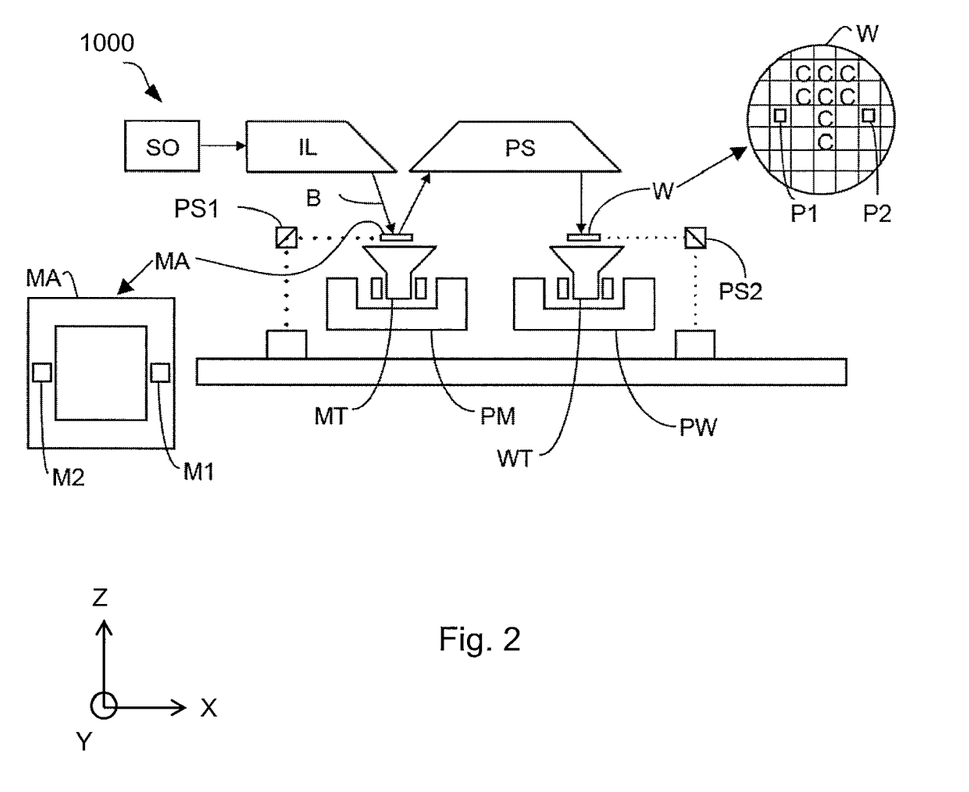
FIG. 2 is a schematic diagram of another lithographic projection apparatus.

FIG. 2 schematically depicts another exemplary lithographic projection apparatus 1000 whose illumination source could be optimized utilizing the methods described herein.

The lithographic projection apparatus 1000 includes:
- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 2, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 2, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-) magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

The lithographic apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference in its entirety.

Figure 3:
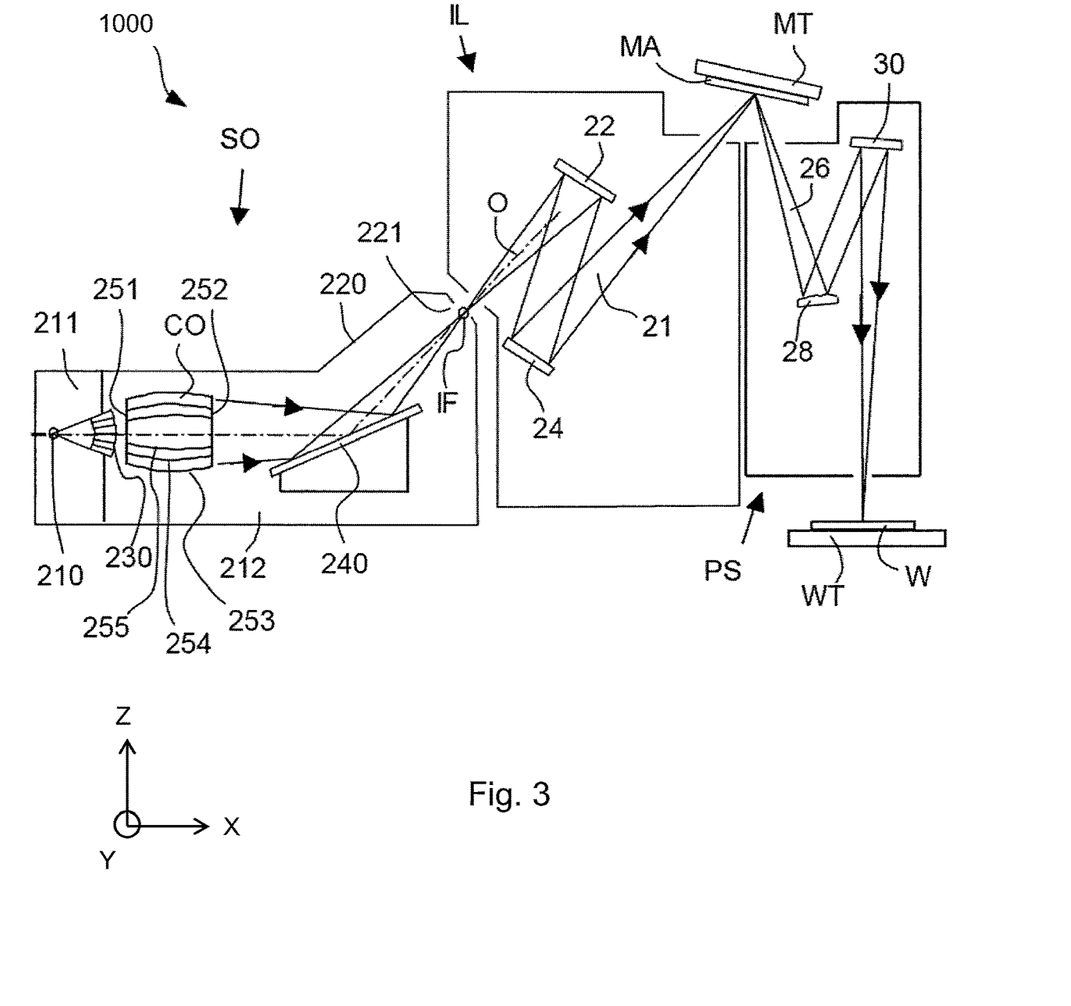
FIG. 3 is a more detailed view of the apparatus in FIG. 9.

FIG. 3 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 3.

Collector optic CO, as illustrated in FIG. 3, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source. Alternatively, the source collector module SO may be part of an LPP radiation system, wherein a laser is arranged to deposit laser energy into a fuel, such as xenon (Xe), tin (Sn) or lithium (Li), to create highly ionized plasma with electron temperatures of several 10's of eV. The energetic radiation generated during de-excitation and recombination of these ions is emitted from the plasma, collected by the collector optic CO and focused onto the opening 221 in the enclosing structure 220.

Although specific reference may be made in this text to the manufacture of ICs, it should be explicitly understood that the description herein has many other possible applications. For example, it may be employed in the manufacture of integrated optical systems, guidance and detection patterns for magnetic domain memories, micro-electro mechanical systems (MEMS), liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

It is noted that the terms "mask", "reticle", "patterning device" are utilized interchangeably herein. Also, person skilled in the art will recognize that, especially in the context of lithography simulation/optimization, the term "mask"/ "patterning device" and "design layout" can be used interchangeably, as in lithography simulation/optimization, that a physical patterning device is not necessarily used but a design layout can be used to represent a physical patterning device.

Lithography technologies already in use include EUV (extreme ultra violet) lithography that uses a wavelength within a range of 20 nm to 5 nm (which can be produced using a synchrotron or by hitting a material (either solid or a plasma) with high energy electrons in order to produce photons within this range). Also, DUV lithography can use, e.g., an about 193 nm wavelength with the use of an ArF laser or an about 157 nm wavelength with the use of a fluorine laser. In the present document, the terms "radiation" and "beam" are used to encompass all types of electromagnetic radiation, including ultraviolet radiation (e.g. with a wavelength of about 365, 248, 193, 157 or 126 nm) and EUV (extreme ultra-violet radiation, e.g. having a wavelength in the range of 5 nm-20 nm).

While the concepts disclosed herein may be used for imaging on a substrate such as a silicon wafer, it shall be understood that the disclosed concepts may be used with any type of lithographic systems, e.g., those used for imaging on substrates other than silicon wafers, using imprint steps, etc.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As mentioned above, a problem encountered in patterning processes is contamination. The reduction and, where possible, the elimination of contamination of a part of an apparatus used in the patterning process desirable. For example, a reduction in contamination of elements of the lithographic apparatus may reduce the number of defects in a pattern or plurality of patterns projected onto a substrate. Ever decreasing wavelengths of radiation used to apply patterns to substrates means that contamination having smaller dimensions becomes even more of a problem. In an embodiment, a particular type of contamination is silica contamination on a surface of a substrate table in, e.g., an immersion lithographic apparatus.

Desirably, there is provided an in situ (or near in situ) method of removing the contamination. This is because it can be more desirable to clean an apparatus in situ rather than to disassemble or open the apparatus to clean therein or to remove the contaminated part for cleaning. Some of the reasons for that include, e.g., risk of further contamination, potential reduction in downtime, etc. In situ removal involves dislodging or removing contamination from a part of the apparatus at its normal working position or positions. Near in situ removal involves dislodging or removing contamination from a part of the apparatus at position where the part is attached to the apparatus but not at a normal working position (e.g., a maintenance position, such as, for a substrate table, a position that it outside of a normal working position, e.g., partially extending outside of the shell of the apparatus or located in an open position within the apparatus displaced from beneath a processing system (such as the projection system)).

So, according to an embodiment, an in situ (or near in situ) way to reduce the contamination of a part of an apparatus used in the patterning process is to employ a substrate which has been specially created to remove and/or dislodge contamination from the apparatus. Such a cleaning substrate may be passed through the apparatus (for example, the lithographic apparatus to project radiation onto a substrate, a coating module, an oven, or any other apparatus used in a patterning process) to reduce the contamination of a part of the apparatus.

In an embodiment, such a substrate physically contacts the surface on which contamination is to be reduced and/or removed, or may attract contaminants, thereby extracting them from the immediate environment. Such a cleaning substrate may be particularly useful for reducing contamination in a lithographic apparatus which employs an immersion fluid. Contamination may be more prevalent in immersion lithography due to the nature of the processes involved. For example, it can be seen from FIG. 1 that an immersion fluid confinement structure IH at least partly retains an immersion fluid between the projection system PL and the substrate W. Pressure is exerted on the top-side of a substrate W (that is, the side of a substrate W which is provided with, among other possible layers, a layer of resist) and other parts of the apparatus by at least the immersion fluid. This pressure can cause part of the resist and/or other material to become loose, and even flake off. Further, the immersion fluid can cause contamination to become deposited on various other parts of the apparatus, such as on a substrate holder and/or the immersion hood, possibly reducing the effectiveness of one or both.

Figure 4:
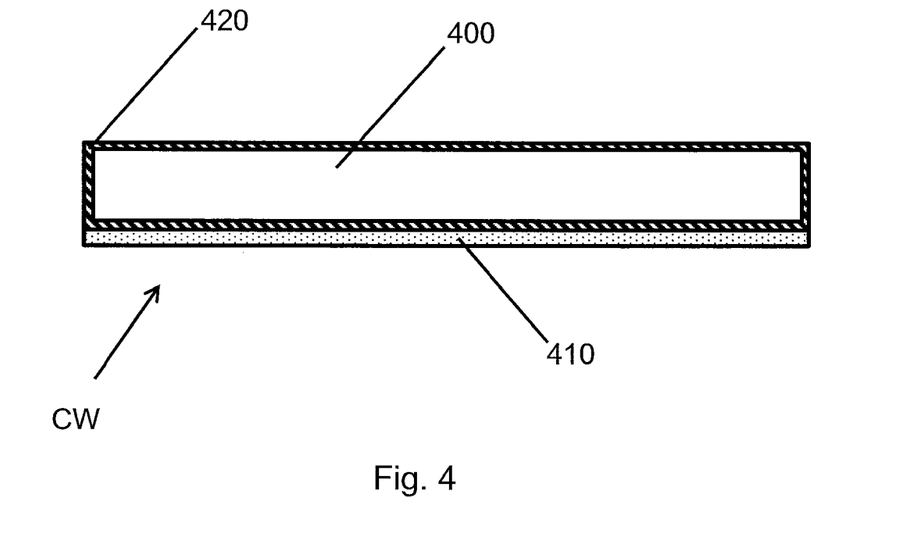
FIG. 4 is a schematic depiction of a cleaning substrate.

FIG. 4 depicts a cleaning substrate CW in accordance with an embodiment. The cleaning substrate CW comprises a support 400 which serves to hold a layer as described hereafter. In an embodiment, the support is a standard substrate in that it is the same width as those substrates which may be covered with a layer of resist and patterned using the lithographic apparatus of FIG. 1. That is, the cleaning substrate CW may be of a standard size used in lithography. For example, the cleaning substrate CW may be an about 200 mm in diameter, or an about 300 mm in diameter, or any other size, substrate used in a lithographic apparatus, may be substantially cylindrical in shape, and/or may have a depth selected from the range of around 0.5 mm to around 3.5 mm. This is so that the cleaning substrate CW can be loaded into and moved around a lithographic apparatus in the same way as a substrate provided with a layer of resist could be. The support 400 may be formed from any suitable material, for example silicon, quartz, metal, etc.

Referring back to FIG. 4, the support 400 is provided with a material 410 (e.g., in the form of a layer). In an embodiment, the material 410 has a chemical designed to chemically react with contamination. That is, when the cleaning substrate CW is placed into contact with the part of the apparatus to be cleaned, a chemical reaction between the chemical of the material 410 and the contamination occurs to enable the contamination to be dislodged or removed.

In an embodiment, the material 410 comprises a chemical that reacts with silica. In an embodiment, the chemical reacts with silica to at least partly dissolve silica.

In an embodiment, the material 410 comprises ammonium fluoride. Ammonium fluoride is effective at dissolving silica. In an embodiment, the material 410 comprises cerium oxide. Cerium oxide is effective at dislodging silica.

In an embodiment, the material 410 is applied in a liquid or liquid-type form (e.g., a paste) on the support 400. For example, ammonium fluoride can be applied onto the support 400 as a liquid or liquid-type form. In an embodiment, the material 410 is applied by a vapor deposition. For example, cerium oxide can be applied onto the support 400 by vapor deposition.

In an embodiment, the support 400 is of a different material than the material 410. In an embodiment, the support 400 is of a different material than the material with which the material 410 is designed to chemically react. For example, the support 400 can be sapphire, e.g., when the material 410 is designed to react with silica. In an embodiment, the support 400 can optionally have a protective coating 420. In an embodiment, the protective coating 420 can be used where the support 400 might be deleteriously affected by a chemical of material 410.

In an embodiment, material 410 comprises a polymer that has therein or retains a material designed to chemically react with contamination. In an embodiment, that material comprises a chemical that reacts with silica, e.g., ammonium fluoride. In an embodiment, the polymer is designed to remove contamination from a part of the apparatus and, in an embodiment, hold the contamination on the cleaning substrate CW.

Figure 5:
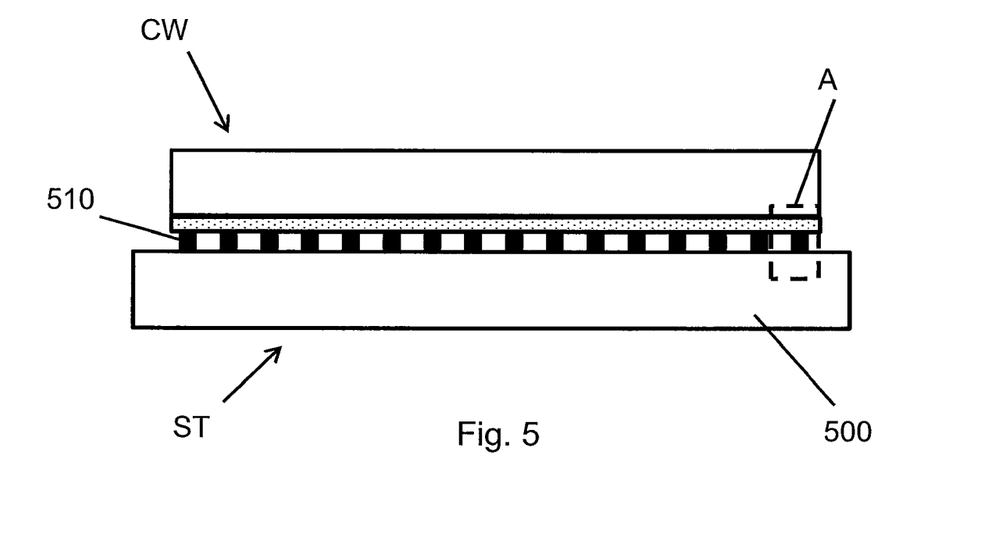
FIG. 5 is a schematic depiction of a cleaning substrate in contact with a substrate table.
Figure 6:
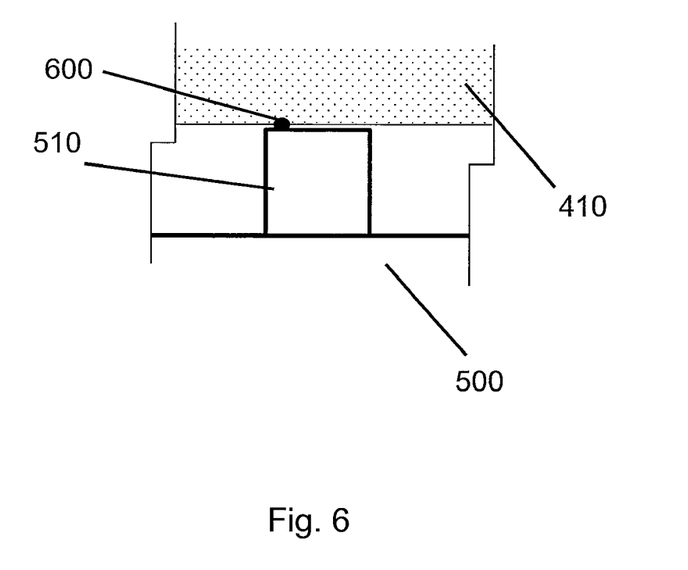
FIG. 6 is a schematic depiction of a detail of FIG. 5.

In an embodiment, the polymer comprises an amine compound or functional group exposed to hydrofluoric acid. As a result, in an embodiment, there would be ammonium fluoride bound to the cleaning substrate CW via the polymer. In an embodiment, the amine compound or functional group has a form of:

In an embodiment, the cleaning substrate would be pressed onto the contaminated part of the apparatus. For example, as shown in FIG. 5, the cleaning substrate can be pressed onto a substrate table ST while the substrate table is an in situ or near in situ position. In a specific example, the substrate table ST would be moved out from underneath a processing system of the apparatus (e.g., a substrate table WT moved from underneath a projection system in a lithographic apparatus) and the cleaning substrate is applied manually. While not as ideal as in situ cleaning may be, this near in situ arrangement is still better than having to swap out the substrate table to perform cleaning. As shown in FIG. 5, the substrate table ST comprises a body 500 and a plurality of projections 510 to support the cleaning substrate CW (and typically substrates W for having devices manufactured thereon). The cleaning substrate CW facilitates dislodging of contamination from one or more of the projections 510. A detail of FIG. 5 in the dashed box A is shown in FIG. 6. As seen in FIG. 6, an example projection 510 is depicted along with some contamination 600, for example silica, on the projection 510. As shown in FIG. 6, the chemical of material 410 of the cleaning substrate CW comes into contact with contamination 600 to cause the contamination 600 to be dislodged (e.g., chemically changed so that the contamination 600 is no longer firmly bonded to the projection 510). At least part of the dislodged contamination 600 can be then be retained by the cleaning substrate CW.

In an embodiment, the cleaning substrate is moved using a substrate handler system of the apparatus designed to process substrates for device manufacturing processing. This can be used where there is little to no risk of the chemical material of the cleaning substrate deleteriously affecting the processing of substrates for device manufacturing. This can be the case where the contamination material is not a material that makes up, or is designed to contact with, substrates on which devices are manufactured or that makes up, or is designed to contact with, other processing apparatus of such substrates. In an embodiment, the substrate is placed into contact with the contaminated part using the substrate handler system or by another substrate moving system (e.g., a moving substrate table) of the apparatus designed to process substrates for device manufacturing processing.

In an embodiment, the cleaning substrate is not moved using a substrate handler system of the apparatus designed to process substrates for device manufacturing processing. This can be the case where the contamination material is a material that makes up, or is designed to contact with, substrates on which devices are manufactured or that makes up, or is designed to contact with, other processing apparatus of such substrates. For example, where the cleaning substrate is designed to clean silica contamination, a substrate handler system of the apparatus might not process the cleaning substrate where it processes silicon substrates.

In an embodiment, the cleaning substrate contacts the contaminated part, between consecutive periods of when the cleaning substrate is out of contact with the contaminated, for a time period selected from the range of 15 seconds to 10 minutes, selected from the range of 30 seconds to 5 minutes, or selected from the range of 1 to 4 minutes. That is, the cleaning substrate is brought into contact with the contaminated part from being out of contact, the above mentioned time period elapses, and then the cleaning substrate is removed from contact with the contaminated part. In an embodiment, the substrate is designed to remove contamination and so no subsequent process may be required of the contaminated part. In an embodiment, a subsequent processing other than contact of the cleaning substrate with the contaminated part is performed. In an embodiment, the subsequent processing comprises a rinsing with a liquid (e.g., water). In an embodiment, the subsequent processing comprises directing a gas flow at the contaminated part.

In an embodiment, the cleaning substrate is repeatedly applied to be in and out of at least firm contact with the contaminated part (for example, where the cleaning substrate CW has cerium oxide). In an embodiment, between firm contacts, there can be relative movement between the cleaning substrate and the contaminated part (e.g., slight rotation or translation). For example, the cleaning substrate can be repeatedly applied to be in and out of full contact with the contaminated part and in an embodiment, when out of full contact, there can be relative movement between the cleaning substrate and the contaminated part. In an embodiment, such relative movement enables a portion of the cleaning substrate to come into contact with a different portion of the part of the apparatus that it previously contacted. As another example, the cleaning substrate can be firmly applied to the contaminated part and then be out of firm contact (but still in contact) so that there can be relative displacement between the cleaning substrate and the contaminated part when out of firm contact; in that case, there can be relative movement between the cleaning substrate CW and the contaminated part to causes the material 410 to rub against the contaminated part so as to dislodge and/or remove contamination from the contaminated part. In an embodiment, the repetition can be selected from the range of 2-40 instances per 5 minutes, or selected from the range of 5-30 instances per 5 minutes, or selected from the range 10-20 instances per 5 minutes. In an embodiment, the cleaning substrate can be clamped to the contaminated part, for example by a clamp of the contaminated part. So, in an embodiment, the repetition of the cleaning substrate being in and out of at least firm contact can provide a mechanical action to aid in chemical removal of the contamination. So, in an embodiment, there is provided a chemical mechanical planarization (CMP) type action by using a substrate coating without using a particle slurry as typically used in CMP.

So, in an embodiment, in use, the cleaning substrate CW may pass through a lithographic apparatus and/or other tool in such a way as to bring the material 410 into contact with a contaminated surface. Bringing the material 410 into contact with such a surface can be achieved by movement of the surface, and/or the cleaning substrate CW, or by appropriate design of the size of the cleaning substrate CW, for example the width, thickness, etc. of the support 400 and/or the material 410.

In an embodiment, the material 410 of the cleaning substrate CW comprises a deformable layer to, e.g., aid in providing contact with a contaminated part surface and/or aid in providing mechanical action. In an embodiment, the deformable layer comprises a plurality of brushes or brush like structures (e.g., fibers, strands, etc.). In an embodiment, the brushes, fibers, strands, etc. forming a layer so closely packed that the layer forms an essentially continuous, unbroken layer. In an embodiment, the substrate surface may have a combination of both closely packed brushes, fibers, strands, etc. and less densely packed brushes, fibers, strands, etc. In an embodiment, the deformable layer comprises a sponge. In an embodiment, the deformable layer comprises poly(vinyl alcohol) and/or polyurethane. So, in an embodiment, contamination may be absorbed by the deformable layer, or contamination may become lodged on and/or in-between portions (e.g., brushes, strands, sponge pores, etc.) of the deformable layer. The deformable layer may also or alternatively dislodge contamination. The dislodged contamination can be washed away by a fluid which may be supplied by the immersion fluid confinement structure IH.

In an embodiment, the material 410 has a roughness, e.g., comprises a series of protrusions and recesses. The roughness (e.g., the protrusions and recesses) can be formed in any convenient manner, for example, using etching, exposure to radiation, scratching the surface (e.g., using chemical or mechanical polishing) or any process appropriate to the material used. In an embodiment, the roughness is relatively uniform across material 410. In an embodiment, the protrusions and recesses of the roughness may vary in height and depth across the material 410. Having different height protrusions and recesses may enable improved access to certain portions of the contaminated part. The height of the protrusions or depths of the recesses should not be such that the protrusions and/or recesses are structurally unstable so as to cause its own contamination (e.g., the protrusion or recess should be no more than five times the width of the feature). The pitch of the protrusions and recesses is defined as the width of a protrusion plus the width of an adjacent recess. The pitch may vary between 50 nm and 1000 nm. The pitch may be varied to preferentially favor the deposition (or in other words, the collection) of contamination in the recesses.

In an embodiment, the cleaning substrate CW and/or the contaminated part is wetted using a liquid. For example, in an embodiment, a liquid (e.g., water such as ultra pure water) is applied by a dispensing system of the apparatus to the cleaning substrate CW and/or to the contaminated part. In an embodiment, the immersion fluid confinement structure IH of a lithographic apparatus is configured to provide liquid (e.g., water) to the cleaning substrate CW and/or to the contaminated part. In an embodiment, the wetted cleaning substrate CW and/or wetted contaminated part is used with a cleaning substrate CW having cerium oxide on the cleaning side of the cleaning substrate CW. In an embodiment, the wetted cleaning substrate CW and/or wetted contaminated part is used with a cleaning substrate CW having a deformable layer on the cleaning side of the cleaning substrate CW.

In an embodiment, the side of the cleaning substrate onto which material 410 is applied is polished or ground to a smooth finish. In an embodiment, a smooth finished surface of the substrate having the material 410 increases local pressure and perhaps increases the contamination removal rate.

In an embodiment, the cleaning substrate CW is used to remove contamination from an immersion fluid confinement structure (for example, the immersion fluid confinement structure IH and projection system PL of FIG. 1). Thus, the cleaning substrate CW is positioned such that the material 410 is brought into contact with a surface of the immersion fluid confinement structure. Contamination on a surface (e.g., lowermost surface) of the immersion fluid confinement structure IH may be removed by moving the cleaning substrate CW relative to the immersion fluid confinement structure IH and/or moving the immersion fluid confinement structure IH relative to the cleaning substrate CW, such that the cleaning substrate CW comes into contact with the surface of the immersion fluid confinement structure IH. In an embodiment, that can facilitated by providing the cleaning substrate CW on a substrate table WT with the material 410 facing toward a surface of the immersion fluid confinement structure IH. By removing contamination from a surface of the immersion fluid confinement structure IH, the chances of this contamination becoming dislodged and contaminating the immersion fluid and/or a substrate being exposed to radiation via the projection system is reduced or eliminated.

Although the cleaning substrate CW has been described, in use, as cleaning an immersion fluid confinement structure IH and/or a substrate table, the cleaning substrate CW may be used instead or additionally to clean another surface. Cleaning of another surface may be achieved in much the same way as the cleaning of the immersion fluid confinement structure IH and/or a substrate table. That is, the cleaning substrate CW and/or the contaminated part can be moved into a position whereby the material 410 is brought into contact with a surface of the contaminated part such that the material may chemically reacts with contamination on the surface (and in an embodiment, the cleaning substrate CW can remove contamination from that surface).

When the cleaning substrate CW has been used to clean a contaminated part, it can be re-used to clean the same or different contaminated part at a later stage. Before being reused, the cleaning substrate CW can be processed to provide "fresh" material 410 and/or where the cleaning substrate CW removes contamination, be processed to remove contamination from the cleaning substrate CW. The processing of a used cleaning substrate CW can involve merely rinsing the cleaning substrate. Additionally or alternatively, the processing of a used cleaning substrate CW can involve stripping the material 410 from the support 400, and replaced with a layer of material 410. Alternatively, a new, replacement cleaning substrate could be used. Alternatively, a layer of material 410 could be superimposed over the used material 410.

The cleaning substrate CW mentioned above may be used specifically and solely as a cleaning substrate. However, the cleaning substrate CW may also have other purposes and/or functions. For example, the cleaning functionality described above can be introduced into a substrate which is normally used for substrate table temperature control, or any other purpose. For example, the cleaning properties described above can be introduced to a reference substrate which is used to align a substrate table, patterning device support structure, etc. of a lithographic apparatus.

It will be appreciated that the cleaning substrate described above, can be used at any appropriate time. For example, the cleaning substrate could be used prior to each and every exposure of a substrate covered with resist. However, this may not be ideal, since throughput may be adversely affected. It may be more desirable to undertake a cleaning process using one or more of the substrates described above before a lot of (e.g. batch) of substrates covered with resist are exposed to the radiation beam.

As already described above, the cleaning substrate may be reused, for example, after appropriate cleaning which may involve stripping the cleaning substrate of layers, etc. which have been contaminated. Alternatively, the cleaning substrate can be disposed of and a new cleaning substrate used to clean a part of the applicable apparatus. Alternatively, a new layer, etc. may be provided over an existing contaminated layer, etc. on the cleaning substrate.

At any one time or successively, more than one cleaning substrate may be used. For example, one cleaning substrate may be used in one part of the applicable apparatus when another substrate is used in another part of the apparatus. For example, a lithographic apparatus may work by exposing one substrate to radiation using one substrate table stage, while another substrate is measured to determine its topography using another substrate table stage. A cleaning substrate could be used to clean the areas in and around these two stages.

One or more aspects of the cleaning substrate described herein may be used in combination on a single substrate. For example, a cleaning substrate may include a layer of brushes and a layer of sponge or a cleaning substrate may include a layer of brushes and an arrangement of the protrusions and recesses described above. Further, the cleaning substrate herein has been mostly depicted as having cleaning functionality on one side of the substrate. Cleaning functionality could be provided on one or more other sides of the substrate to provide further cleaning (e.g., cleaning at the same time of the immersion liquid confinement structure IH and the substrate table WT on which the cleaning substrate is supported to clean the immersion liquid confinement structure IH) or to provide a "clean" surface to be used in cleaning when the other surface is contaminated after use.

As mentioned above, the cleaning substrate described may be used to clean any appropriate surface of a patterning process apparatus. The cleaning substrate may even be used outside of the field of substrate patterning. However, the cleaning substrate mentioned above is suited to use in substrate patterning and in particular immersion substrate patterning where contamination of parts contacted by the immersion fluid is a considerable problem, and one that is likely to increase in the future with the use of ever decreasing exposure wavelengths. A significant advantage of using a cleaning substrate to clean an apparatus used in lithography is that the apparatus is already configured to handle substrates. This means that the apparatus can be cleaned by the cleaning substrate without having to open or at least partially dismantle the apparatus, which could otherwise allow further contamination to enter the apparatus.

So, in an embodiment, there is provided a cleaning substrate having a chemical designed to chemically react with contamination with which the cleaning substrate comes into contact. In an embodiment, there is provided a cleaning substrate having a polymer layer, the polymer having therein or retaining a chemical designed to chemically react with contamination with which the cleaning substrate comes into contact. In an embodiment, the chemical comprises ammonium fluoride. In an embodiment, the chemical comprises cerium oxide. In an embodiment, the cleaning substrate is designed to chemically react with silica to dislodge or remove silica contamination from a part of an apparatus. In an embodiment, there is provided a method of cleaning a contaminated part using a cleaning substrate as described herein. In an embodiment, there is provided an apparatus having a control system configured to execute a method as described herein.

In an embodiment, there is provided a method of dislodging contamination from a part of an apparatus used in a patterning process, the method comprising: providing a cleaning substrate into contact with the part of the apparatus while the part is attached to the apparatus, the cleaning substrate comprising a material configured to chemically react with the contamination; and dislodging contamination on the part of the apparatus by chemical reaction between the material and the contamination.

In an embodiment, the contamination comprises silica and the chemical reaction is between the material and silica. In an embodiment, the material comprises ammonium fluoride. In an embodiment, the material comprises cerium oxide. In an embodiment, the material comprises a polymer. In an embodiment, the polymer comprises an amine compound or functional group exposed to hydrofluoric acid. In an embodiment, the method further comprises introducing relative movement between the cleaning substrate and the part of the apparatus to dislodge contamination from the part of the apparatus. In an embodiment, the introducing the relative movement comprises repeatedly bringing the cleaning substrate and the part of the apparatus into and out of contact and between during at a few of the occasions where the cleaning substrate is out of contact with the part of the apparatus, causing the cleaning substrate to be displaced or rotated so that a portion of the cleaning substrate comes into contact with a different portion of the part of the apparatus than it previously contacted. In an embodiment, the method further comprises removing the dislodged contamination from the apparatus using the cleaning substrate. In an embodiment, the cleaning substrate has essentially the same dimensions as a substrate to which a resist is applied. In an embodiment, the method comprises the providing the cleaning substrate in contact with the part, between consecutive periods of when the cleaning substrate is out of contact with the part, for a time period selected from the range of 15 seconds to 10 minutes, selected from the range of 30 seconds to 5 minutes, or selected from the range of 1 to 4 minutes.

In an embodiment, the method further comprises wetting the cleaning substrate and/or the part of the apparatus contacted by the cleaning substrate.

In an embodiment, there is provided a cleaning substrate for dislodging contamination from a part of an apparatus used in a patterning process, the cleaning substrate having a size and shape essentially corresponding to a substrate for device manufacturing in the patterning process and the cleaning substrate comprising a material configured to chemically react with the contamination. In an embodiment, the contamination comprises silica and the chemical reaction is between the material and silica. In an embodiment, the material comprises ammonium fluoride. In an embodiment, the material comprises cerium oxide. In an embodiment, the material comprises a polymer. In an embodiment, the polymer comprises an amine compound or functional group exposed to hydrofluoric acid.

In an embodiment, there is provided a combination comprising: a cleaning substrate comprising a material configured to chemically react with contamination; and a non-transitory computer program product comprising machine-readable instructions configured to cause a computer to cause providing of the cleaning substrate into contact with a part of an apparatus used in a patterning process while the part is attached to the apparatus, where upon the material chemically reacts with the contamination to dislodge the contamination on the part of the apparatus.

Figure 7:
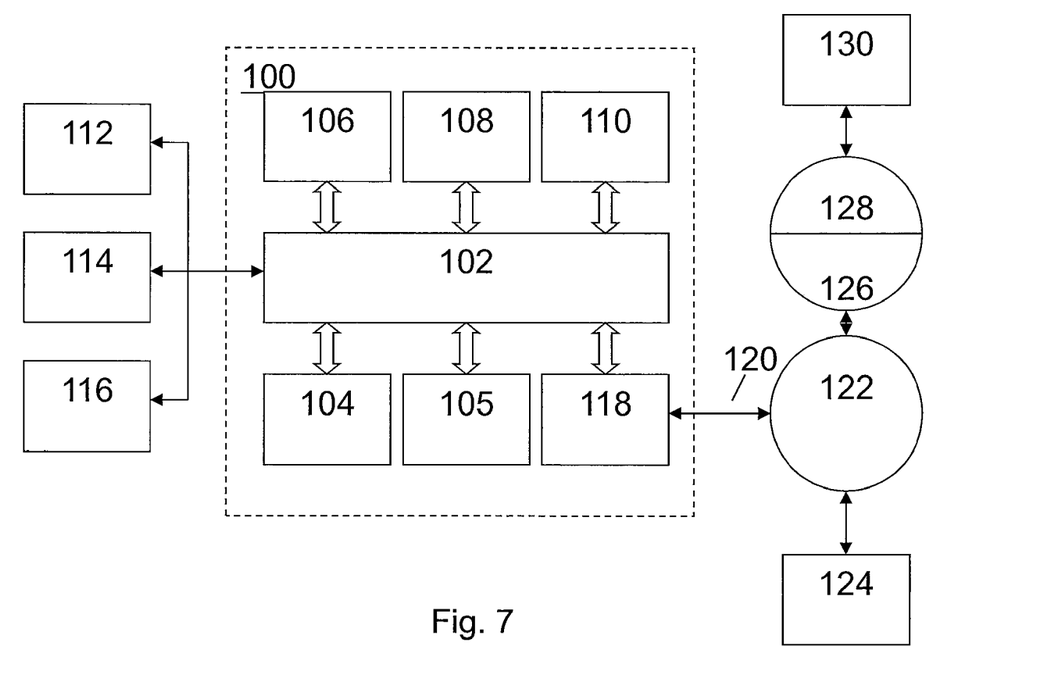
FIG. 7 is a block diagram of an example computer system.

FIG. 7 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hardwired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the disclosure as described without departing from the scope of the claims set out below.

What is claimed is:

1. A method of dislodging contamination from a part of an apparatus used in a patterning process, the method comprising:
    providing a cleaning substrate into contact with the part of the apparatus while the part is attached to the apparatus, the cleaning substrate comprising a material configured to chemically react with the contamination and the material comprising a polymer comprising an amine compound or amine functional group, exposed to hydrofluoric acid; and
    dislodging contamination on the part of the apparatus by chemical reaction between the material and the contamination.

2. The method of claim 1, wherein the contamination comprises silica and the chemical reaction is between the material and silica.

3. The method of claim 1, wherein the material comprises ammonium fluoride.

4. The method of claim 1, wherein the material comprises cerium oxide.

5. The method of claim 1, further comprising introducing relative movement between the cleaning substrate and the part of the apparatus to dislodge contamination from the part of the apparatus.

6. The method of claim 5, wherein the introducing the relative movement comprises repeatedly bringing the cleaning substrate and the part of the apparatus into and out of contact and between at least a few of the occasions where the cleaning substrate is out of contact with the part of the apparatus, causing the cleaning substrate to be displaced or rotated so that a portion of the cleaning substrate comes into contact with a different portion of the part of the apparatus than it previously contacted.

7. The method of claim 1, further comprising removing the dislodged contamination from the apparatus using the cleaning substrate.

8. The method of claim 1, wherein the cleaning substrate has essentially the same dimensions as a substrate to which a resist is applied.

9. The method of claim 1, comprising the providing the cleaning substrate in contact with the part, between consecutive periods of when the cleaning substrate is out of contact with the part, for a time period selected from the range of 15 seconds to 10 minutes, selected from the range of 30 seconds to 5 minutes, or selected from the range of 1 to 4 minutes.

10. The method of claim 1, further comprising wetting the cleaning substrate and/or the part of the apparatus contacted by the cleaning substrate.

11. An apparatus used in a process to apply patterns to a substrate, the apparatus comprising a control system configured to cause performance of the method of claim 1.

12. A non-transitory computer program product comprising machine-readable instructions for causing a processor to cause performance of the method of claim 1.

13. A cleaning substrate for dislodging contamination from a part of an apparatus used in a patterning process, the cleaning substrate having a size and shape essentially corresponding to a substrate for device manufacturing in the patterning process and the cleaning substrate comprising a material configured to chemically react with the contamination and the material comprising a polymer comprising an amine compound or amine functional group, exposed to hydrofluoric acid.

14. The cleaning substrate of claim 13, wherein the contamination comprises silica and the chemical reaction is between the material and silica.

15. The cleaning substrate of claim 13, wherein the material comprises ammonium fluoride.

16. The cleaning substrate of claim 13, wherein the material comprises cerium oxide.

17. A combination comprising:
the cleaning substrate of claim 13; and
a non-transitory computer program product comprising machine-readable instructions configured to cause a computer to cause providing of the cleaning substrate into contact with a part of an apparatus used in a patterning process while the part is attached to the apparatus, where upon the material chemically reacts with the contamination to dislodge the contamination on the part of the apparatus.

18. A method of comprising:
providing a cleaning substrate into contact with a movable the part of an apparatus used in a patterning process, the part arranged to support the cleaning substrate while the part is attached to the apparatus, the cleaning substrate comprising a material comprising cerium oxide and the cleaning substrate and/or part being wet; and
dislodging contamination on a surface of the part of the apparatus supporting the cleaning substrate by contact between the wet material and contamination.

19. The method of claim 18, further comprising introducing relative movement between the cleaning substrate and the part of the apparatus to dislodge contamination from the part of the apparatus.

20. The method of claim 19, wherein the introducing the relative movement comprises repeatedly bringing the cleaning substrate and the part of the apparatus into and out of contact and between at least a few of the occasions where the cleaning substrate is out of contact with the part of the apparatus, causing the cleaning substrate to be displaced or rotated so that a portion of the cleaning substrate comes into contact with a different portion of the part of the apparatus than it previously contacted.

21. The method of claim 20, wherein the repetition is selected from the range of 2-40 instances per 5 minutes.

* * * * *